United States Patent
Suzuki et al.

(10) Patent No.: US 8,221,941 B2
(45) Date of Patent: Jul. 17, 2012

(54) PHOTOMASK BLANK MANUFACTURING METHOD AND PHOTOMASK MANUFACTURING METHOD

(75) Inventors: Toshiyuki Suzuki, Tokyo (JP); Masahiro Hashimoto, Tokyo (JP); Kazunori Ono, Tokyo (JP); Ryo Ohkubo, Tokyo (JP); Kazuya Sakai, Tokyo (JP)

(73) Assignee: Hoya Corporation, Tokyo (JP)

( * ) Notice: Subject to any disclaimer, the term of this patent is extended or adjusted under 35 U.S.C. 154(b) by 135 days.

(21) Appl. No.: 12/647,808

(22) Filed: Dec. 28, 2009

(65) Prior Publication Data

US 2010/0167185 A1 Jul. 1, 2010

(30) Foreign Application Priority Data

Dec. 29, 2008 (JP) .................. 2008-335663

(51) Int. Cl.
*G03F 1/22* (2012.01)
(52) U.S. Cl. ............................................ 430/5
(58) Field of Classification Search .............. 430/5, 322, 430/324, 330; 428/426, 432, 433
See application file for complete search history.

(56) References Cited

U.S. PATENT DOCUMENTS

2006/0257752 A1 11/2006 Kim et al.

FOREIGN PATENT DOCUMENTS

| JP | 2002156742 A | 5/2002 |
|---|---|---|
| JP | 2002162726 A | 6/2002 |
| JP | 2002229183 A | 8/2002 |
| JP | 2002258455 A | 9/2002 |
| JP | 2004199035 A | 7/2004 |
| JP | 2004226593 | 8/2004 |
| JP | 2005062894 | 3/2005 |
| JP | 3722029 B2 | 9/2005 |
| JP | 2005241693 A | 9/2005 |
| JP | 2005331554 A | 12/2005 |
| JP | 2006184355 A | 7/2006 |
| JP | 2006317665 A | 11/2006 |
| JP | 4026000 B2 | 10/2007 |
| JP | 4076989 B2 | 2/2008 |
| KR | 10-0617389 B1 | 5/2005 |
| WO | 2004059384 A1 | 7/2004 |

OTHER PUBLICATIONS

Korean Office Action mailed on Jul. 25, 2011 in counterpart Korean Application No. 10-2009-0131609.

*Primary Examiner* — Stephen Rosasco
(74) *Attorney, Agent, or Firm* — Sughrue Mion, PLLC

(57) ABSTRACT

A thin film made of a material containing a metal and silicon is formed on a light-transmissive substrate. Then, a treatment is performed to modify a main surface of the thin film in advance so that when exposure light having a wavelength of 200 nm or less is accumulatively irradiated on a thin film pattern of a photomask to be produced by patterning the thin film, the transfer characteristic of the thin film pattern does not change more than a predetermined degree. This treatment is performed by carrying out, for example, a heat treatment in an atmosphere containing oxygen at 450° C. to 900° C.

24 Claims, 1 Drawing Sheet

PHOTOMASK BLANK MANUFACTURING METHOD AND PHOTOMASK MANUFACTURING METHOD

This application is based upon and claims the benefit of priority from Japanese Patent Application No. 2008-335663, filed on Dec. 29, 2008, the disclosure of which is incorporated herein in its entirety by reference.

TECHNICAL FIELD

This invention relates to methods of manufacturing a photomask blank and a photomask and, in particular, relates to a method of manufacturing a photomask blank for use in the manufacture of a photomask to be suitably used in an exposure apparatus using exposure light having a short wavelength of 200 nm or less and to a method of manufacturing such a photomask.

BACKGROUND ART

Generally, fine pattern formation is carried out by photolithography in the manufacture of a semiconductor device. A number of substrates called photomasks are normally used for such fine pattern formation. The photomask comprises generally a light-transmissive glass substrate having thereon a fine pattern made of a metal thin film or the like. The photolithography is used also in the manufacture of the photomask.

In the manufacture of a photomask by photolithography, use is made of a photomask blank having a thin film (e.g. a light-shielding film) for forming a transfer pattern (mask pattern) on a light-transmissive substrate such as a glass substrate. The manufacture of the photomask using the photomask blank comprises an exposure process of writing a required pattern on a resist film formed on the photomask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the photomask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the light-transmissive substrate. In this manner, the photomask is produced.

For miniaturization of a pattern of a semiconductor device, it is necessary to shorten the wavelength of exposure light for use in photolithography in addition to miniaturization of the mask pattern of the photomask. In recent years, the wavelength of exposure light for use in the manufacture of a semiconductor device has been shortened from KrF excimer laser light (wavelength: 248 nm) to ArF excimer laser light (wavelength: 193 nm).

As a type of photomask, a halftone phase shift mask is known apart from a conventional binary mask having a light-shielding film pattern made of a chromium-based material on a light-transmissive substrate. This halftone phase shift mask is configured to have a light-semitransmissive film on a light-transmissive substrate. This light-semitransmissive film is made of, for example, a material containing a molybdenum silicide compound and is adapted to transmit light having an intensity that does not substantially contribute to exposure (e.g. 1% to 20% with respect to an exposure wavelength) and to produce a predetermined phase difference. By the use of light-semitransmissive portions formed by patterning the light-semitransmissive film and light-transmissive portions formed with no light-semitransmissive film and adapted to transmit light having an intensity that substantially contributes to exposure, the halftone phase shift mask causes the phase of the light transmitted through the light-semitransmissive portions to be substantially inverted with respect to that of the light transmitted through the light-transmissive portions so that the lights having passed near the boundaries between the light-semitransmissive portions and the light-transmissive portions and bent into the others' regions due to diffraction cancel each other out. This makes the light intensity at the boundaries approximately zero to thereby improve the contrast, i.e. the resolution, at the boundaries.

In recent years, there have also appeared a binary mask for ArF excimer laser light using a material containing a molybdenum silicide compound as a light-shielding film, and the like.

SUMMARY OF THE INVENTION

Following the reduction in exposure light wavelength in recent years, however, mask degradation due to repeated use of a photomask has become notable. Particularly in the case of a phase shift mask, a phenomenon occurs in which the transmittance and the phase difference change and further the line width changes (increases) due to irradiation of ArF excimer laser light (wavelength: 193 nm). In the case of the phase shift mask, such changes in transmittance and phase difference are serious problems that affect the mask performance. If the change in transmittance becomes large, the transfer accuracy is degraded, while if the change in phase difference becomes large, the phase shift effect at the pattern boundaries is difficult to obtain so that the contrast at the pattern boundaries is lowered and thus the resolution is significantly reduced. Further, the change in line width degrades the CD accuracy of the photomask and finally degrades the CD accuracy of a pattern-transferred wafer.

According to the study of the present inventor, the background of the problem of the mask degradation due to repeated use of the photomask is assumed as follows. Conventionally, for example, when haze is generated, cleaning is carried out for removing the haze, but a film loss (dissolution) due to the cleaning cannot be avoided and thus, roughly, the number of times of cleaning determines the mask lifetime. However, since the number of times of cleaning is reduced due to an improvement to haze in recent years, the period of time of repeated use of a photomask is prolonged and thus the exposure time is prolonged correspondingly, and therefore, a problem of light fastness particularly to short-wavelength light such as ArF excimer laser light has been newly actualized.

Also conventionally, in order to improve the light fastness of a light-semitransmissive film, for example, a light-semitransmissive film (phase shift film) mainly composed of a metal and silicon is heat-treated in the atmosphere or an oxygen atmosphere at 250 to 350° C. for 90 to 150 minutes (see JP-A-2002-156742) or a cap layer mainly composed of a metal and silicon is formed on a light-semitransmissive film (phase shift film) mainly composed of a metal and silicon (see JP-A-2002-258455). However, a further improvement in light fastness of a film to exposure light is required in the course of the reduction in wavelength of exposure light in recent years.

Further, since the photomask manufacturing cost has been significantly increasing following the pattern miniaturization, there is an increasing need for a longer lifetime of a photomask and, also from this aspect, the further improvement in light fastness of the photomask is required.

It is therefore an object of this invention to provide photomask blank and photomask manufacturing methods that can improve the light fastness of a thin film such as a light-semitransmissive film to exposure light having a wavelength of 200 nm or less, thereby improving the lifetime of a photomask.

The present inventor has assumed a cause of degradation of a photomask due to its repeated use becoming notable following the reduction in exposure light wavelength, as follows.

As a result of examining a light-semitransmissive film pattern of a phase shift mask subjected to changes in transmittance and phase difference and a change (increase) in line width due to its repeated use, the present inventor has found that a modified layer containing Si, O, and a little Mo is formed on the surface layer side of a MoSi-based film and this is one of main causes of the changes in transmittance, phase difference, and line width. The reason (mechanism) for the formation of such a modified layer is considered as follows. That is, the conventional sputtered MoSi-based film (light-semitransmissive film) structurally has gaps and, even if annealing is carried out after the film formation, the change in structure of the MoSi-based film is small, and therefore, for example, oxygen ($O_2$) or water ($H_2O$) in the atmosphere, ozone ($O_3$) produced by reaction of oxygen ($O_2$) with ArF excimer laser light, or the like enters the gaps and reacts with Si and Mo forming the light-semitransmissive film in the course of using the photomask. That is, when Si and Mo forming the light-semitransmissive film are subjected to irradiation of exposure light (particularly short-wavelength light such as ArF excimer laser light) in such an environment, they are excited into a transition state so that Si is oxidized and expanded (because $SiO_2$ is larger in volume than Si) and Mo is also oxidized, thereby forming the modified layer on the surface layer side of the light-semitransmissive film. Then, while accumulatively subjected to the irradiation of the exposure light due to repeated use of the photomask, the oxidation and expansion of Si further proceed and the oxidized Mo diffuses in the modified layer to be deposited on a surface thereof and sublimated as, for example, $MoO_3$, and as a result, the thickness of the modified layer gradually increases (the occupation ratio of the modified layer in the MoSi-based film gradually increases). This phenomenon of the formation and enlargement of the modified layer is significantly observed in the case of short-wavelength exposure light such as ArF excimer laser light having energy necessary for exciting Si and Mo, i.e. the constituent atoms, of the light-semitransmissive film into the transition state, which triggers the oxidation reactions of those atoms.

Based on the elucidated fact and consideration described above, the present inventor has paid attention to suppressing the oxidation rate of a thin film such as a MoSi-based film as a measure for suppressing formation and enlargement of a modified layer and, as a result of further continuing intensive studies, has completed this invention.

Specifically, in order to achieve the above-mentioned object, this invention has aspects listed below.

(Aspect 1) A method of manufacturing a photomask blank having, on a light-transmissive substrate, a thin film for forming a transfer pattern, said method comprising:

forming, on said light-transmissive substrate, said thin film made of a material containing a metal and silicon; and then performing a treatment to modify a main surface of said formed thin film in advance so that when exposure light having a wavelength of 200 nm or less is accumulatively irradiated on a thin film pattern of a photomask to be produced by patterning said thin film, a transfer characteristic of said thin film pattern does not change more than a predetermined degree.

(Aspect 2) The method according to Aspect 1, wherein a layer containing silicon and oxygen is formed at a surface layer of said thin film by said treatment.

(Aspect 3) The method according to Aspect 1, wherein said treatment is a heat treatment in an atmosphere containing oxygen at 450° C. to 900° C.

(Aspect 4) The method according to Aspect 1, wherein said treatment is annealing by flash lamp irradiation in an atmosphere containing oxygen with an energy density of 5 to 14 $J/cm^2$.

(Aspect 5) The method according to claim 1, wherein said treatment is an oxygen plasma treatment.

(Aspect 6) The method according to Aspect 1, wherein a surface layer, modified by said treatment, of said thin film has a thickness of 10 nm or less.

(Aspect 7) A method of manufacturing a photomask blank having, on a light-transmissive substrate, a thin film for forming a transfer pattern, said method comprising:

forming, on said light-transmissive substrate, said thin film made of a material containing a metal and silicon; and then forming a protective film on said formed thin film so that when exposure light having a wavelength of 200 nm or less is accumulatively irradiated on a thin film pattern of a photomask to be produced by patterning said thin film, a transfer characteristic of said thin film pattern does not change more than a predetermined degree.

(Aspect 8) The method according to Aspect 7, wherein said protective film is made of a material containing silicon and oxygen.

(Aspect 9) The method according to Aspect 7, wherein said protective film has a thickness of 15 nm or less.

(Aspect 10) The method according to Aspect 1 or 7, wherein said thin film is a light-semitransmissive film made of a material containing a compound of transition metal silicide.

(Aspect 11). The method according to Aspect 10, wherein said transition metal silicide is molybdenum silicide.

(Aspect 12) The method according to Aspect 1 or 7, wherein said thin film is a light-shielding film made of a material containing a compound of transition metal silicide.

(Aspect 13) The method according to claim 12, wherein said transition metal silicide is molybdenum silicide.

(Aspect 14) A method of manufacturing a photomask, comprising a step of patterning said thin film in the photomask blank according to Aspect 1 or 7 by etching.

According to Aspect 1, by performing the treatment to modify (change the property of) the main surface of the thin film in advance, it is possible to suppress the oxidation rate of Si atoms forming the thin film and thus to suppress formation and enlargement of a modified layer conventionally caused by Si oxidation and expansion. Therefore, even if the photomask is repeatedly used with short-wavelength light, such as ArF excimer laser light, having a wavelength of 200 nm or less as exposure light so that the exposure light with the wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

As recited in Aspect 2, the above-mentioned treatment is, for example, a treatment to modify the main surface of the thin film in advance to form a layer containing silicon and oxygen at a surface layer of the thin film.

The mechanism for the formation of the modified layer in the MoSi-based film, for example, is as described before and, in that case, the oxidation rate (dx/dt) of Si is given by $dx/dt = k \cdot C_0/N_0$, where k is an oxidation reaction coefficient on an oxidation interface, $C_0$ is an $O_2/H_2O$ concentration on an oxidation interface, and $N_0$ is the number of $SiO_2$ molecules per unit volume. Therefore, for example, it is possible to suppress the oxidation rate of Si by increasing the value of $N_0$. Accordingly, by performing the treatment to modify the main surface of the thin film in advance to form the layer containing silicon and oxygen at the surface layer of the thin film as recited in Aspect 2, the number of $SiO_2$ molecules at the surface layer of the thin film is increased to thereby suppress the oxidation rate of Si. By this, even if the photomask is irradiated with exposure light such as ArF excimer laser light in an environment containing $H_2O$, $O_2$, or $O_3$, it is possible to effectively suppress formation and enlargement of a modified layer conventionally caused by Si oxidation and expansion. Therefore, even if the photomask is repeatedly used so that exposure light having a wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

As the treatment to modify the main surface of the thin film in advance, a heat treatment is preferably carried out in an atmosphere containing oxygen at 450° C. to 900° C., for example, as recited in Aspect 3. Alternatively, as recited in Aspect 4, annealing by flash lamp irradiation is preferably carried out in an atmosphere containing oxygen with an energy density of 5 to 14 $J/cm^2$. Alternatively, as recited in Aspect 5, an oxygen plasma treatment is preferably carried out.

The surface layer, modified by the treatment to modify the main surface of the thin film in advance, of the thin film preferably has a thickness of 10 nm or less (Aspect 6).

According to Aspect 7, by forming a protective film on the formed thin film, it is possible to suppress the oxidation rate of Si atoms forming the thin film and thus to suppress formation and enlargement of a modified layer conventionally caused by Si oxidation and expansion. Therefore, even if the photomask is repeatedly used with short-wavelength light, such as ArF excimer laser light, having a wavelength of 200 nm or less as exposure light so that the exposure light with the wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

As recited in Aspect 8, the protective film is preferably made of a material containing silicon and oxygen. For example, by forming a protective film made of a material containing silicon and oxygen on a MoSi-based thin film to thereby increase the above-mentioned number of $SiO_2$ molecules ($N_0$) at the surface of the thin film, it is possible to suppress the oxidation rate of Si.

In this case, the thickness of the protective film is preferably 15 nm or less (Aspect 9).

This invention is suitable for the manufacture of, for example, a phase shift mask blank in which the thin film is a light-semitransmissive film made of a material containing a compound of transition metal silicide as recited in Aspect 10 or a binary mask blank in which the thin film is a light-shielding film made of a material containing a compound of transition metal silicide as recited in Aspect 11. Particularly, this invention is suitable for the manufacture of a phase shift mask blank or a binary mask blank using a thin film made of a material containing a compound of molybdenum silicide among transition metal silicides (Aspect 12).

By a photomask manufacturing method comprising a step of patterning the thin film in the photomask blank by etching as recited in Aspect 13, there is obtained a photomask improved in light fastness to short-wavelength exposure light such as ArF excimer laser light and thus significantly improved in mask lifetime.

DESCRIPTION OF THE EMBODIMENTS

Figure 1:
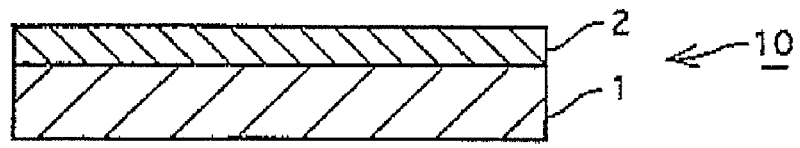
FIG. 1 is a sectional view of a phase shift mask blank according to an Example of this invention.

Hereinbelow, embodiments of this invention will be described in detail.

First Embodiment

This embodiment is a method of manufacturing a photomask blank having, on a light-transmissive substrate, a thin film for forming a transfer pattern and comprises forming, on the light-transmissive substrate, the thin film made of a material containing a metal and silicon, and then performing a treatment to modify (change the property of) a main surface of the formed thin film in advance so that when exposure light having a wavelength of 200 nm or less is accumulatively irradiated on a thin film pattern of a photomask to be produced by patterning the thin film, the transfer characteristic of the thin film pattern does not change more than a predetermined degree.

The light-transmissive substrate is not particularly limited as long as it has transparency with respect to an exposure wavelength to be used. In this invention, a quartz substrate and various other glass substrates (e.g. soda-lime glass substrate, aluminosilicate glass substrate, etc.) can be used and, among them, the quartz substrate is particularly suitable because it has high transparency in a range of ArF excimer laser light or shorter-wavelength light.

The thin film for forming the transfer pattern is a thin film made of a material containing a metal and silicon, such as, for example, a light-semitransmissive film or a light-shielding film made of a material containing a compound of transition metal silicide (particularly molybdenum silicide), which will be described in detail later.

As a method of forming the thin film on the light-transmissive substrate, a sputtering film forming method, for example, is preferably carried out, but not limited thereto.

In this embodiment, as the treatment to modify the main surface of the thin film in advance, a heat treatment is carried out in an atmosphere containing oxygen at 450° C. to 900° C. If the heating temperature is less than 450° C., there is a problem that the wash resistance and the hot water resistance are reduced. On the other hand, if the heating temperature is higher than 900° C., there arises a possibility of degradation of the thin film itself.

It is particularly preferable that the heating temperature be in a range of 550° C. to 650° C. This is because it is considered that Si—N bonds increase around 600° C.

A heating apparatus for use in the heat treatment is optional, such as a heating furnace, an oven, or a hot plate.

The heat treatment is carried out in an atmosphere containing oxygen and is preferably carried out, for example, in an oxygen-substituted atmosphere in a heating furnace. Naturally, the heat treatment may be carried in the atmosphere.

The heat treatment time may be determined by taking into account both the heating temperature and the thickness of a surface layer, to be modified by the heat treatment, of the thin film and is, in general, suitably about 1 to 3 hours.

In this embodiment, the thickness of the surface layer, modified by the heat treatment to modify the main surface of the thin film in advance, of the thin film is preferably 10 nm or less and particularly preferably 5 nm or less. If the thickness of the modified surface layer is greater than 10 nm, the change in transmittance due to the modified surface layer becomes large so that it is difficult to perform a film design expecting in advance such a change in transmittance. The lower limit of the thickness of the modified surface layer is preferably 1 nm or more. If it is less than 1 nm, the effect of suppressing the oxidation rate of Si forming the thin film is not sufficiently obtained.

According to this embodiment, by performing the heat treatment in an atmosphere containing oxygen at 450° C. to 900° C. as the treatment to modify the main surface of the thin film in advance, it is possible to modify the main surface of the thin film in advance to thereby form a layer containing silicon and oxygen at the surface layer of the thin film. By forming the layer containing silicon and oxygen at the surface layer of the thin film, the number of $SiO_2$ molecules at the surface layer of the thin film is increased to thereby suppress the oxidation rate of Si. By this, even if the photomask is irradiated with exposure light such as ArF excimer laser light in an environment containing $H_2O$, $O_2$, or $O_3$, it is possible to effectively suppress formation and enlargement of a modified layer conventionally caused by Si oxidation and expansion. Therefore, even if the photomask is repeatedly used so that exposure light having a wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

According to a photomask blank obtained by this embodiment, when, for example, ArF excimer laser light is continuously irradiated on a photomask produced using this photomask blank so that the total dose becomes 30 kJ/cm$^2$, changes in optical properties after the irradiation of, for example, a MoSi-based light-semitransmissive film are such that the change in transmittance can be 0.60% or less and the change in phase difference can be 3.0 degrees or less. Further, the change in transmittance can be 0.05% or less and the change in phase difference can be 1.0 degrees or less. In this manner, the changes in optical properties are suppressed to be small and the changes on this level do not affect the performance of the photomask. Further, also with respect to an increase in line width (CD change) of a light-semitransmissive film pattern, it can be suppressed to 5 nm or less.

When, likewise, ArF excimer laser light is continuously irradiated on a photomask produced using a binary mask blank, having, for example, a MoSi-based light-shielding film, obtained by this embodiment so that the total dose becomes 30 kJ/cm$^2$, it is possible to suppress an increase in line width (CD change) of a light-shielding film pattern to 5 nm or less.

The dose of 30 kJ/cm$^2$ (energy density: about 25 mJ/cm$^2$) corresponds to use of about 100,000 times of a photomask and corresponds to use for about three months with a normal frequency of use of a photomask. Therefore, according to this invention, it can be said that it is possible to further improve, than conventional, the light fastness of a thin film such as a light-semitransmissive film to exposure light having a wavelength of 200 nm or less, thereby significantly improving the lifetime of a photomask.

Second Embodiment

In this embodiment, as the treatment to modify the main surface of the thin film in advance, annealing by flash lamp irradiation is carried out in an atmosphere containing oxygen with an energy density of 5 to 14 J/cm$^2$. If the irradiation energy density is less than 5 J/cm$^2$, there is a problem that the wash resistance and the hot water resistance are reduced. On the other hand, if the irradiation energy density is higher than 14 J/cm$^2$, there arises a possibility of degradation of the thin film itself.

In this invention, it is particularly preferable that the energy density in an atmosphere containing oxygen for the flash lamp annealing be in a range of 8 to 12 J/cm$^2$.

In this embodiment, the flash lamp annealing is preferably carried out, for example, in the atmosphere or in an atmosphere containing oxygen and is particularly preferably carried out in an atmosphere containing oxygen (e.g. a mixed gas atmosphere of oxygen and nitrogen).

It is preferable that the substrate coated with the thin film be heated in the flash lamp annealing. The substrate heating temperature is preferably in a range of, for example, about 150 to 350° C.

The treatment time by the flash lamp irradiation (irradiation time) may be determined by taking into account both the irradiation energy density and the thickness of a surface layer, to be modified by the annealing, of the thin film and is, in general, suitably about 1 to 5 ms.

in this embodiment, the thickness of the surface layer, modified by the flash lamp annealing to modify the main surface of the thin film in advance, of the thin film is preferably 10 nm or less and particularly preferably 5 nm or less. If the thickness of the modified surface layer is greater than 10 nm, the change in transmittance due to the modified surface layer becomes large so that it is difficult to perform a film design expecting in advance such a change in transmittance. The lower limit of the thickness of the modified surface layer is preferably 1 nm or more. If it is less than 1 nm, the effect of suppressing the oxidation rate of Si forming the thin film is not sufficiently obtained.

According to this embodiment, by performing the annealing by flash lamp irradiation in an atmosphere containing oxygen with an energy density of 5 to 14 J/cm$^2$ as the treatment to modify the main surface of the thin film in advance, it is possible to modify the main surface of the thin film in advance to thereby form a layer containing silicon and oxygen at the surface layer of the thin film. By forming the layer containing silicon and oxygen at the surface layer of the thin film, the number of $SiO_2$ molecules at the surface layer of the thin film is increased to thereby suppress the oxidation rate of Si. By this, even if the photomask is irradiated with exposure light such as ArF excimer laser light in an environment containing $H_2O$, $O_2$, or $O_3$, it is possible to effectively suppress formation and enlargement of a modified layer conventionally caused by Si oxidation and expansion. Therefore, even if the photomask is repeatedly used so that exposure light having a wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

According to a photomask blank obtained by this embodiment, when, for example, ArF excimer laser light is continuously irradiated on a photomask produced using this photomask blank so that the total dose becomes 30 kJ/cm$^2$, it is possible to suppress changes in transfer characteristics more than the above-mentioned first embodiment, wherein changes in optical properties after the irradiation of, for example, a MoSi-based light-semitransmissive film are such that the change in transmittance can be 0.50% or less and the change in phase difference can be 3.0 degrees or less and, further, with respect to an increase in line width (CD change) of a light-semitransmissive film pattern, it can be suppressed to 5 nm or less. When, likewise, ArF excimer laser light is continuously irradiated on a photomask produced using a binary mask blank, having, for example, a MoSi-based light-shielding film, obtained by this embodiment so that the total dose becomes 30 kJ/cm$^2$, it is possible to suppress an increase in line width (CD change) of a light-shielding film pattern to 5 nm or less.

Before performing the flash lamp annealing, a low-temperature heat treatment at, for example, 280° C. or less may be applied to the substrate coated with the thin film.

Third Embodiment

In this embodiment, as the treatment to modify the main surface of the thin film in advance, art oxygen plasma treatment is carried out. Specifically, the oxygen plasma treatment is carried out, for example, by setting the inside of a chamber to an oxygen gas atmosphere and applying a predetermined RF ICP power and RF bias power to thereby convert an oxygen gas into a plasma and irradiating the oxygen plasma on the thin film placed in the chamber.

It is preferable that the substrate coated with the thin film be heated in the oxygen plasma treatment.

The treatment time by the oxygen plasma irradiation (irradiation time) may be determined by taking into account both the oxygen plasma treatment conditions and the thickness of a surface layer, to be modified by the treatment, of the thin film and is, in general, suitably about 1 to 10 minutes.

In this embodiment, the thickness of the surface layer, modified by the oxygen plasma treatment to modify the main surface of the thin film in advance, of the thin film is preferably 10 nm or less and particularly preferably 5 nm or less. If the thickness of the modified surface layer is greater than 10 nm, the change in transmittance due to the modified surface layer becomes large so that it is difficult to perform a film design expecting in advance such a change in transmittance. The lower limit of the thickness of the modified surface layer is preferably 1 nm or more. If it is less than 1 nm, the effect of suppressing the oxidation rate of Si forming the thin film is not sufficiently obtained.

According to this embodiment, by performing the oxygen plasma treatment as the treatment to modify the main surface of the thin film in advance, it is possible to modify the main surface of the thin film in advance to thereby form a layer containing silicon and oxygen at the surface layer of the thin film. By forming the layer containing silicon and oxygen at the surface layer of the thin film, the number of SiO$_2$ molecules at the surface layer of the thin film is increased to thereby suppress the oxidation rate of Si. By this, even if the photomask is irradiated with exposure light such as ArF excimer laser light in an environment containing H$_2$O, O$_2$, or O$_3$, it is possible to effectively suppress formation and enlargement of a modified layer conventionally caused by Si oxidation and expansion. Therefore, even if the photomask is repeatedly used so that exposure light having a wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

According to a photomask blank obtained by this embodiment, when, for example, ArF excimer laser light is continuously irradiated on a photomask produced using this photomask blank so that the total dose becomes 30 kJ/cm$^2$, it is possible to suppress changes in transfer characteristics more than the above-mentioned first embodiment, wherein changes in optical properties after the irradiation of, for example, a MoSi-based light-semitransmissive film are such that the change in transmittance can be 0.1% or less and the change in phase difference can be 1.0 degree or less and, further, with respect to an increase in line width (CD change) of a light-semitransmissive film pattern, it can be suppressed to 5 nm or less. When, likewise, ArF excimer laser light is continuously irradiated on a photomask produced using a binary mask blank, having, for example, a MoSi-based light-shielding film, obtained by this embodiment so that the total dose becomes 30 kJ/cm$^2$, it is possible to suppress an increase in line width (CD change) of a light-shielding film pattern to 5 nm or less.

Before performing the oxygen plasma treatment, a low-temperature heat treatment at, for example, 280° C. or less may be applied to the substrate coated with the thin film.

Fourth Embodiment

In this embodiment, a thin film made of a material containing a metal and silicon is formed on a light-transmissive substrate and then a protective film is formed on the formed thin film so that when exposure light having a wavelength of 200 nm or less is accumulatively irradiated on a thin film pattern of a photomask to be produced by patterning the thin film, the transfer characteristic of the thin film pattern does not change more than a predetermined degree. By forming the protective film on the formed thin film, it is possible to suppress the oxidation rate of Si atoms forming the thin film and thus to suppress formation and enlargement of a modified layer conventionally caused by Si oxidation and expansion.

The protective film is preferably made of a material containing silicon and oxygen. For example, by forming a protective film made of a material containing silicon and oxygen on a MoSi-based thin film to thereby increase the above-mentioned number of SiO$_2$ molecules (N$_0$) at the surface of the thin film, it is possible to suppress the oxidation rate of Si. As the material containing silicon and oxygen of the protective film, SiON, SiO$_2$, SiOC, or SiOCN, for example, can be used. Among them, SiON or SiO$_2$ is particularly preferable.

As a method of forming the protective film on the thin film, a sputtering film forming method, for example, can be preferably used. Naturally, the method is not necessarily limited to the sputtering film forming method and another film forming method may alternatively be used.

In this embodiment, the thickness of the protective film formed on the thin film is preferably 15 nm or less and particularly preferably 10 nm or less. If the thickness of the protective film is greater than 15 nm, the change in transmittance due to the formed protective film becomes large so that it is difficult to perform a film design expecting in advance such a change in transmittance. The lower limit of the thickness of the protective film is preferably 3 nm or more. If it is less than 3 nm, the effect of suppressing the oxidation rate of Si forming the thin film is not sufficiently obtained.

According to this embodiment, by forming the protective film containing, for example, silicon and oxygen on the thin film, the number of $SiO_2$ molecules at a surface layer of the thin film is increased to thereby suppress the oxidation rate of Si. By this, even if the photomask is irradiated with exposure light such as ArF excimer laser light in an environment containing $H_2O$, $O_2$, or $O_3$, it is possible to effectively suppress formation and enlargement of a modified layer conventionally caused by Si oxidation and expansion. Therefore, even if the photomask is repeatedly used so that exposure light having a wavelength of 200 nm or less is accumulatively irradiated on the thin film pattern of the photomask, it is possible to suppress the change in transfer characteristic of the thin film pattern such as, for example, a change in transmittance, phase difference, or line width of a light-semitransmissive film.

According to a photomask blank obtained by this embodiment, when, for example, ArF excimer laser light is continuously irradiated on a photomask produced using this photomask blank so that the total dose becomes 30 $kJ/cm^2$, it is possible to suppress changes in transfer characteristics more than the above-mentioned first embodiment, wherein changes in optical properties after the irradiation of, for example, a MoSi-based light-semitransmissive film are such that the change in transmittance can be 0.1% or less and the change in phase difference can be 1.0 degree or less and, further, with respect to an increase in line width (CD change) of a light-semitransmissive film pattern, it can be suppressed to 5 nm or less. When, likewise, ArF excimer laser light is continuously irradiated on a photomask produced using a binary mask blank, having, for example, a MoSi-based light-shielding film, obtained by this embodiment so that the total dose becomes 30 $kJ/cm^2$, it is possible to suppress an increase in line width (CD change) of a light-shielding film pattern to 5 nm or less.

As described by the several embodiments, this invention is suitable for the manufacture of a photomask blank for manufacturing a photomask for use in an exposure apparatus using short-wavelength exposure light having a wavelength of particularly 200 nm or less. For example, this invention is suitable for the manufacture of the following photomask blanks.

(1) Phase Shift Mask Blank in which the Thin Film is a light-Semitransmissive Film Made of a Material Containing a Compound of Transition Metal Silicide (Particularly Molybdenum Silicide)

In the case of the above-mentioned phase shift mask blank, when a phase shift mask is produced using this phase shift mask blank, even if the photomask is repeatedly used with short-wavelength light such as ArF excimer laser light as exposure light, changes in transmittance, phase difference, and line width of the light-semitransmissive film are suppressed so that the performance is not degraded, and therefore, the lifetime of the photomask can be significantly improved.

As such a phase shift mask blank, there is a photomask blank with a structure having a light-semitransmissive film on a light-transmissive substrate, which is for producing a halftone phase shift mask of the type in which shifter portions are provided by patterning the light-semitransmissive film.

The light-semitransmissive film is adapted to transmit light having an intensity that does not substantially contribute to exposure (e.g. 1% to 20% with respect to an exposure wavelength) and to produce a predetermined phase difference (e.g. 180 degrees). By the use of light-semitransmissive portions formed by patterning the light-semitransmissive film and light-transmissive portions formed with no light-semitransmissive film and adapted to transmit light having an intensity that substantially contributes to exposure, the halftone phase shift mask causes the phase of the light transmitted through the light-semitransmissive portions to be substantially inverted with respect to that of the light transmitted through the light-transmissive portions so that the lights having passed near the boundaries between the light-semitransmissive portions and the light-transmissive portions and bent into the others' regions due to diffraction cancel each other out. This makes the light intensity at the boundaries approximately zero to thereby improve the contrast, i.e. the resolution, at the boundaries.

As another phase shift mask blank, there is a photomask blank with a structure having a light-shielding film or a light-semitransmissive film on a light-transmissive substrate, which is for producing a Levenson-type phase shift mask or an enhancer-type phase shift mask of the substrate dug-down type in which shifter portions are provided by digging down the light-transmissive substrate by etching or the like.

Further, as another phase shift mask blank, there is a photomask blank with a structure having a light-semitransmissive film on a light-transmissive substrate and further having a light-shielding film on the light-semitransmissive film for preventing pattern failure of a transfer target due to a light-semitransmissive film pattern to be formed in a transfer region based on light transmitted through the light-semitransmissive film.

The light-semitransmissive film is made of a material containing a transition metal silicide compound and use can be made of a material mainly composed of transition metal silicide and oxygen and/or nitrogen. As a transition metal, use can be made of molybdenum, tantalum, tungsten, titanium, hafnium, nickel, vanadium, zirconium, niobium, palladium, ruthenium, rhodium, or the like.

Particularly, when the light-semitransmissive film is made of molybdenum silicide nitride (MoSiN) and a heat treatment is carried out as a treatment to modify a main surface of the MoSiN film, the content of Mo and Si in the MoSiN film is preferably such that Mo is 10% or more and 14% or less (preferably 11% or more and 13% or less) for maintaining a predetermined phase difference and transmittance and suppressing a change in transmittance due to the heat treatment.

In the case of the structure having the light-shielding film on the light-semitransmissive film, since the material of the light-semitransmissive film contains transition metal silicide, a material of the light-shielding film is composed of chromium having etching selectivity (etching resistance) to the light-semitransmissive film, or a chromium compound in which an element such as oxygen, nitrogen, or carbon is added to chromium.

Further, in the case of the structure having the light-shielding film on the light-semitransmissive film, it is preferable that, after forming the light-semitransmissive film, the treatment to modify the main surface of the light-semitransmissive film in advance be carried out and then the light-shielding film be formed.

(2) Binary Mask Blank in which the Thin Film is a Light-Shielding Film Made of a Material Containing a Compound of Transition Metal Silicide (Particularly Molybdenum Silicide)

In the case of the binary mask blank with the transition metal silicide-based light-shielding film, when a binary mask is produced using this binary mask blank, even if the photomask is repeatedly used with short-wavelength light such as ArF excimer laser light as exposure light, a reduction in light-shielding properties of the light-shielding film and a change in line width thereof are suppressed so that the performance is not degraded, and therefore, the lifetime of the photomask can be significantly improved.

Such a binary mask blank has a structure in which the light-shielding film is formed on a light-transmissive substrate. The light-shielding film is made of a material containing a transition metal silicide compound and use can be made of a material mainly composed of transition metal silicide and oxygen and/or nitrogen. As a transition metal, use can be made of molybdenum, tantalum, tungsten, titanium, hafnium, nickel, vanadium, zirconium, niobium, palladium, ruthenium, rhodium, or the like.

Particularly, when the light-shielding film is made of molybdenum silicide compounds and has a two-layer structure of a light-shielding layer (MoSi or the like) and a front-surface antireflection layer (MoSiON or the like) or a three-layer structure further comprising a back-surface antireflection layer (MoSiON or the like) between the light-shielding layer and the substrate, the content of Mo and Si in the molybdenum silicide compound of the light-shielding layer is preferably such that Mo is 9% or more and 40% or less (preferably 15% or more and 40% or less and more preferably 20% or more and 40% or less) in terms of the light-shielding properties.

The light-shielding film may be a composition gradient film in which the composition in its thickness direction changes continuously or stepwise.

In order to reduce the thickness of a resist film to thereby form a fine pattern, the binary mask blank may have a structure in which an etching mask film is formed on the light-shielding film. This etching mask film is made of a material composed of chromium having etching selectivity (etching resistance) to etching of the light-shielding film containing transition metal silicide, or a chromium compound in which an element such as oxygen, nitrogen, or carbon is added to chromium.

Further, in the case of the structure having the etching mask film on the light-shielding film, it is preferable that, after forming the light-shielding film, the treatment to modify the main surface of the light-shielding film in advance be carried out and then the etching mask film be formed.

This invention can also be carried out as a photomask manufacturing method comprising a step of patterning the thin film in the photomask blank by etching. As the etching in this event, use is preferably made of dry etching effective for forming a fine pattern.

According to such a photomask manufacturing method, there is obtained a photomask improved in light fastness to short-wavelength exposure light such as ArF excimer laser light so that degradation in transfer characteristics due to exposure light irradiation is suppressed even if the photomask is repeatedly used and the lifetime of the photomask is significantly improved.

The treatment to modify the main surface of the thin film may be carried out again for the photomask. That is, with respect to the photomask produced using the photomask blank obtained by any of the above-mentioned first to fourth embodiments, any of the heat treatment in an atmosphere containing oxygen at 450° C. to 900° C., the treatment to form a protective film of SiON or the like, and the treatment by oxygen plasma irradiation, for example, may be carried out again.

Specifically, (1) the heat treatment or the oxygen plasma treatment may be applied to a photomask produced using a photomask blank formed with a protective film of SiON or the like, (2) the heat treatment, the protective film forming treatment, or the oxygen plasma treatment may be applied to a photomask produced using a photomask blank subjected to the oxygen plasma treatment, (3) the heat treatment, the oxygen plasma treatment, or the protective film forming treatment may be applied to a photomask produced using a photomask blank subjected to the flash lamp annealing, and (4) the oxygen plasma treatment, the heat treatment, or the protective film forming treatment may be applied to a photomask produced using a photomask blank subjected to the heat treatment.

In this manner, by applying the treatment of this invention also to a formed thin film pattern in addition to the treatment of this invention at the stage of a photomask blank, particularly side walls of the pattern can be protected so that it is possible to achieve film strengthening at the side walls of the pattern and thus to further reduce a change in line width.

EXAMPLES

Hereinbelow, the embodiments of this invention will be described in further detail in terms of Examples.

Example 1

FIG. 1 is a sectional view of a phase shift mask blank 10 of this Example.

Using a synthetic quartz glass substrate having a 6-inch square size with a thickness of 0.25 inches as a light-transmissive substrate 1, a light-semitransmissive film 2 made of nitrided molybdenum and silicon was formed on the light-transmissive substrate 1.

Specifically, using a mixed target of molybdenum (Mo) and silicon (Si) (Mo:Si=12 mol %:88 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:$N_2$:He=8:72:100) at a gas pressure of 0.3 Pa, thereby forming a MoSiN film made of molybdenum, silicon, and nitrogen and having a thickness of 69 nm. The MoSiN film had a transmittance of 4.52% and a phase difference of 182.5 degrees for ArF excimer laser light.

Then, a heat treatment was applied to the substrate formed with the MoSiN film. Specifically, using a heating furnace, the heat treatment was carried out in the atmosphere at a heating temperature of 550° C. for a heating time of 1 hour. Upon observing a section of the MoSiN film in detail after the heat treatment using a TEM (transmission electron microscope), a coating film with a thickness of about 1 nm was formed at a surface layer portion of the MoSiN film. Further, upon analyzing the composition of this coating film in detail, it was confirmed to be a film mainly containing Si and oxygen. The MoSiN film after the heat treatment had a transmittance of 6.16% and a phase difference of 184.4 degrees for ArF excimer laser light. Therefore, changes after the heat treatment were such that the change in transmittance was +1.64% and the change in phase difference was +1.9 degrees. The film design may be carried out expecting these changes in advance, thereby obtaining desired optical properties.

In the manner described above, the phase shift mask blank 10 of this Example was manufactured.

Figure 2:
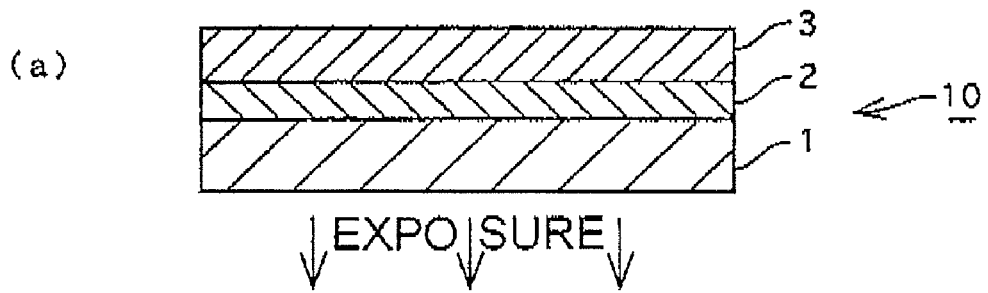
FIG. 2, (a) to (e) are sectional views showing processes of manufacturing a phase shift mask using the phase shift mask blank of FIG. 1.
Figure 2:
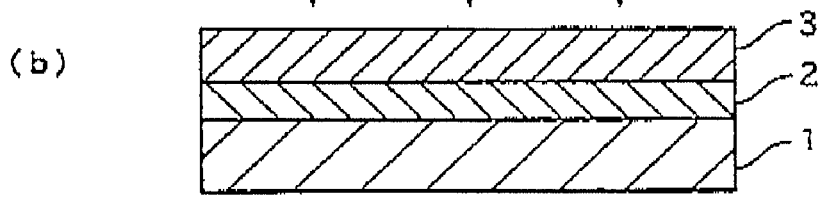
Figure 2:
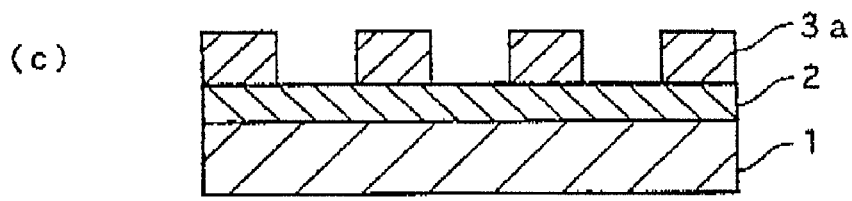
Figure 2:
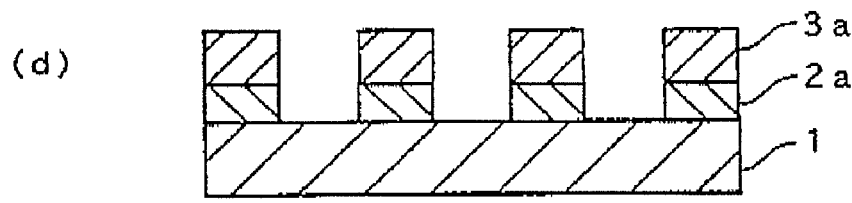
Figure 2:
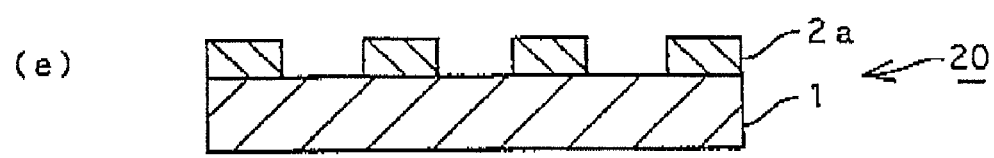

Then, a halftone phase shift mask was manufactured using the phase shift mask blank 10. FIG. 2, (a) to (e) are sectional views showing processes of manufacturing a halftone phase shift mask 20 using the phase shift mask blank 10. First, a chemically amplified positive resist film for electron beam writing (PRL009 manufactured by FUJIFILM Electronic Materials Co., Ltd.) was formed as a resist film 3 on the mask blank 10 (see FIG. 2, (a)). The resist film 3 was formed by spin coating using a spinner (spin coating apparatus).

Then, using an electron beam writing apparatus, a required pattern was written on the resist film 3 formed on the mask blank 10 and, thereafter, the resist film 3 was developed with a predetermined developer, thereby forming a resist pattern 3a (see FIG. 2, (b) and (c)).

Then, using the resist pattern 3a as a mask, the light-semitransmissive film (MoSiN film) 2 was dry-etched, thereby forming a light-semitransmissive film pattern 2a (see FIG. 2, (d)). A mixed gas of SF6 and He was used as a dry etching gas.

Then, the remaining resist pattern was stripped, thereby obtaining the phase shift mask 20 (see FIG. 2, (e)). There was almost no change in transmittance and phase difference of the light-semitransmissive film as compared with those at the time of the manufacture of the mask blank 10.

ArF excimer laser light was continuously irradiated on the obtained phase shift mask so that the total dose became 30 kJ/cm$^2$. As described before, the dose of 30 kJ/cm$^2$ (energy density: about 25 mJ/cm$^2$) corresponds to use of about 100,000 times of a photomask and corresponds to use for about three months with a normal frequency of use of a photomask.

The transmittance and phase difference of the light-semitransmissive film (MoSiN film) after the irradiation were measured. As a result, the transmittance was 6.70% and the phase difference was 181.9 degrees for ArF excimer laser light. Therefore, changes after the irradiation were such that the change in transmittance was +0.54% and the change in phase difference was −2.5 degrees, and thus, the changes were suppressed to be small and the changes on this level do not affect the performance of the photomask. Further, a section of the light-semitransmissive film pattern was observed in detail using a TEM (transmission electron microscope). As a result, a modified layer as conventionally formed was not particularly confirmed and, further, an increase in line width (CD change) was suppressed to less than 5 nm. Therefore, it is seen that the phase shift mask blank and the phase shift mask of this Example have extremely high light fastness to accumulative irradiation of short-wavelength exposure light having a wavelength of 200 nm or less.

Example 2

A MoSiN film was formed as a light-semitransmissive film on a light-transmissive substrate in the same manner as in Example 1 except that the MoSi ratio of a mixed target was changed.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen (N$_2$), and helium (He) (gas flow rate ratio Ar:N$_2$:He=8:72:100) at a gas pressure of 0.3 Pa, thereby forming a MoSiN film made of molybdenum, silicon, and nitrogen and having a thickness of 69 nm.

The MoSiN film had a transmittance of 4.86% and a phase difference of 177.6 degrees for ArF excimer laser light.

Then, annealing by flash lamp irradiation was applied to the substrate formed with the MoSiN film. Specifically, the inside of a chamber was set to a mixed gas atmosphere of O$_2$ and N$_2$ (gas flow rate ratio O$_2$:N$_2$=30:70) and flash lamp light with an energy density of 10 J/cm$^2$ was irradiated on the MoSiN film. In this event, the irradiation time of the flash lamp light was set to 5 msec and the substrate heating temperature was set to 300° C. Upon observing a section of the MoSiN film in detail after the flash lamp irradiation using a TEM (transmission electron microscope), a coating film with a thickness of about 2 nm was formed at a surface layer portion of the MoSiN film. Further, upon analyzing the composition of this coating film in detail, it was confirmed to be a film mainly containing Si and oxygen. The MoSiN film after the flash lamp irradiation had a transmittance of 5.79% and a phase difference of 182.8 degrees for ArF excimer laser light. Therefore, changes after the flash lamp irradiation were such that the change in transmittance was +0.93% and the change in phase difference was +6.2 degrees.

In the manner described above, a phase shift mask blank of this Example was manufactured.

Then, a halftone phase shift mask was manufactured using this phase shift mask blank in the same manner as in Example 1. There was almost no change in transmittance and phase difference of the light-semitransmissive film in the manufactured phase shift mask as compared with those at the time of the manufacture of the mask blank.

ArF excimer laser light was continuously irradiated on the obtained phase shift mask of this Example so that the total dose became 30 kJ/cm$^2$. The transmittance and phase difference of the light-semitransmissive film (MoSiN film) after the irradiation were measured. As a result, the transmittance was 6.25% and the phase difference was 180.6 degrees for ArF excimer laser light. Therefore, changes after the irradiation were such that the change in transmittance was +0.46% and the change in phase difference was −2.2 degrees, and thus, the changes were suppressed to be small and the changes on this level do not affect the performance of the photomask. Further, a section of a light-semitransmissive film pattern was observed in detail using a TEM (transmission electron microscope). As a result, a modified layer as conventionally formed was not particularly confirmed and, further, an increase in line width (CD change) was suppressed to less than 5 nm. Therefore, it is seen that the phase shift mask blank and the phase shift mask of this Example also have extremely high light fastness to accumulative irradiation of short-wavelength exposure light having a wavelength of 200 nm or less.

Example 3

A MoSiN film was formed as a light-semitransmissive film on a light-transmissive substrate in the same manner as in Example 2. The transmittance and phase difference of the MoSiN film for ArF excimer laser light were approximately the same as those in Example 2.

Then, an oxygen plasma treatment was applied to the substrate formed with the MoSiN film. Specifically, by setting the inside of a chamber to an O$_2$ gas atmosphere (O$_2$ gas flow rate: 100 sccm, pressure: 5 Pa) and applying the RE ICP power at 750 W and the RF bias power at 250 W, the O$_2$ gas was formed into a plasma and the formed oxygen plasma was irradiated on the MoSiN film. In this event, the irradiation time of the oxygen plasma was set to 5 minutes and 10 minutes to measure changes in optical properties in the respective cases.

When the irradiation time was 5 minutes, the MoSiN film after the oxygen plasma irradiation was such that the transmittance was 5.16% and the phase difference was 184.7 degrees for ArF excimer laser light. Therefore, changes after the oxygen plasma irradiation were such that the change in transmittance was +0.27% and the change in phase difference was +3.7 degrees.

On the other hand, when the irradiation time was 10 minutes, the MoSiN film after the oxygen plasma irradiation was such that the transmittance was 5.27% and the phase difference was 180.2 degrees for ArF excimer laser light. Therefore, changes after the oxygen plasma irradiation were such that the change in transmittance was +0.36% and the change in phase difference was −0.3 degrees.

Upon observing a section of the MoSiN film in detail after the oxygen plasma irradiation using a TEM (transmission electron microscope), a coating film with a thickness of about 5 to 10 nm was formed at a surface layer portion of the MoSiN film for each irradiation time. Further, upon analyzing the composition of this coating film in detail, it was confirmed to be a film mainly containing Si and oxygen.

In the manner described above, phase shift mask blanks of this Example were manufactured.

Then, halftone phase shift masks were manufactured using these phase shift mask blanks in the same manner as in Example 1. There was almost no change in transmittance and phase difference of the light-semitransmissive films in the manufactured phase shift masks as compared with those at the time of the manufacture of the mask blanks.

ArF excimer laser light was continuously irradiated on each of the obtained phase shift masks of this Example so that the total dose became 30 kJ/cm$^2$. The transmittance and phase difference of each light-semitransmissive film (MoSiN film) after the irradiation were measured.

In the case of the light-semitransmissive film for which the oxygen plasma irradiation time was 5 minutes, the transmittance was 5.13% and the phase difference was 184.2 degrees for ArF excimer laser light. Therefore, changes after the irradiation were such that the change in transmittance was +0.03% and the change in phase difference was −0.5 degrees.

On the other hand, in the case of the light-semitransmissive film for which the oxygen plasma irradiation time was 10 minutes, the transmittance was 5.31% and the phase difference was 179.9 degrees for ArF excimer laser light. Therefore, changes after the irradiation were such that the change in transmittance was +0.045 and the change in phase difference was +2.6 degrees.

Therefore, the changes were suppressed to be small and the changes on this level do not affect the performance of the photomask. Further, a section of each of light-semitransmissive film patterns was observed in detail using a TEM (transmission electron microscope). As a result, a modified layer as conventionally formed was not particularly confirmed and, further, an increase in line width (CD change) was suppressed to less than 5 nm. Therefore, it is seen that the phase shift mask blanks and the phase shift masks of this Example also have extremely high light fastness to accumulative irradiation of short-wavelength exposure light having a wavelength of 200 nm or less.

Example 4

A MoSiN film was formed as a light-semitransmissive film on a light-transmissive substrate in the same manner as in Example 2. The transmittance and phase difference of the MoSiN film for ArF excimer laser light were approximately the same as those in Example 2.

Then, a SiON film was formed on the MoSiN film by sputtering. Specifically, using a Si target, reactive sputtering (DC sputtering) was carried out by setting the power of a DC power supply to 3.0 kW in a mixed gas atmosphere of Ar and nitrogen monoxide (NO) (gas flow rate ratio Ar:NO=1:4) at a gas pressure of 0.2 Pa, thereby forming a SiON film made of silicon, oxygen, and nitrogen and having a thickness of 10 nm. The MoSiN film with this SiON film had a transmittance of 6.23% and a phase difference of 184.8 degrees for ArF excimer laser light. Therefore, changes after the SiON film formation were such that the change in transmittance was +1.36% and the change in phase difference was +3.7 degrees.

In the manner described above, a phase shift mask blank of this Example was manufactured.

Then, a halftone phase shift mask was manufactured using this phase shift mask blank in the same manner as in Example 1. There was almost no change in transmittance and phase difference of the light-semitransmissive film in the manufactured phase shift mask as compared with those at the time of the manufacture of the mask blank.

ArF excimer laser light was continuously irradiated on the obtained phase shift mask of this Example so that the total dose became 30 kJ/cm$^2$. The transmittance and phase difference of the light-semitransmissive film (MoSiN film) after the irradiation were measured. As a result, the transmittance was 6.22% and the phase difference was 184.3 degrees for ArF excimer laser light. Therefore, changes after the irradiation were such that the change in transmittance was −0.01% and the change in phase difference was −0.5 degrees, and thus, the changes were suppressed to be small and the changes on this level do not affect the performance of the photomask. Further, a section of a light-semitransmissive film pattern was observed in detail using a TEM (transmission electron microscope). As a result, a modified layer as conventionally formed was not particularly confirmed and, further, an increase in line width (CD change) was suppressed to less than 5 nm. Therefore, it is seen that the phase shift mask blank and the phase shift mask of this Example also have extremely high light fastness to accumulative irradiation of short-wavelength exposure light having a wavelength of 200 nm or less.

Example 5

Using a synthetic quartz glass substrate having a 6-inch square size with a thickness of 0.25 inches as a light-transmissive substrate, a MoSiON film (back-surface antireflection layer), a MoSi film (light-shielding layer), and a MoSiON film (front-surface antireflection layer) were formed as a light-shielding film on the light-transmissive substrate.

Specifically, using a mixed target of Mo and Si (Mo:Si=21 mol %:79 mol %), reactive sputtering (DC sputtering) was carried out by setting the power of a DC power supply to 3.0 kW in a mixed gas atmosphere of Ar, $O_2$, $N_2$, and He (gas flow rate ratio Ar:$O_2$:$N_2$:He=5:4:49:42) at a gas pressure of 0.2 Pa, thereby forming a film made of molybdenum, silicon, oxygen, and nitrogen (Mo: 0.3 at %, Si: 24.6 at %, O: 22.5 at %, N: 52.6 at %) and having a thickness of 7 nm.

Then, using a mixed target of Mo:Si=21 mol %:79 mol %, reactive sputtering (DC sputtering) was carried out by setting the power of a DC power supply to 2.0 kW in a mixed gas atmosphere of Ar and He (gas flow rate ratio Ar:He=20:120) at a gas pressure of 0.3 Pa, thereby forming a film made of molybdenum and silicon (Mo: 21.0 at %, Si: 79 at %) and having a thickness of 30 nm.

Then, using a mixed target of Mo:Si=4 mol %:96 mol %, reactive sputtering (DC sputtering) was carried out by setting the power of a DC power supply to 3.0 kW in a mixed gas atmosphere of Ar, $O_2$, $N_2$, and He (gas flow rate ratio Ar:$O_2$:$N_2$:He=6:5:11:16) at a gas pressure of 0.1 Pa, thereby forming a film made of molybdenum, silicon, oxygen, and nitrogen (Mo: 1.6 at %, Si: 38.8 at %, O: 18.8 at %, N: 41.1 at %) and having a thickness of 15 nm.

The total thickness of the light-shielding film was set to 52 nm. The optical density (OD) of the light-shielding film was 3.0 at the wavelength 193 nm of ArF excimer laser exposure light.

Then, a heat treatment was applied to the substrate formed with the light-shielding film. Specifically, using a heating furnace, the heat treatment was carried out in the atmosphere at a heating temperature of 550° C. for a heating time of 1 hour.

In the manner described above, a binary mask blank of this Example was manufactured.

Then, a binary mask was manufactured using this binary mask blank. First, a chemically amplified positive resist film for electron beam writing (PRL009 manufactured by FUJIFILM Electronic Materials Co., Ltd.) was formed on the mask blank.

Then, using an electron beam writing apparatus, a required pattern was written on the resist film formed on the mask blank and, thereafter, the resist film was developed with a predetermined developer, thereby forming a resist pattern.

Then, using the resist pattern as a mask, the three-layer structure light-shielding film was dry-etched, thereby forming a light-shielding film pattern. A mixed gas of Cl2 and $O_2$ (Cl2:$O_2$=4:1) was used as a dry etching gas.

Then, the remaining resist pattern was stripped, thereby obtaining a binary mask of this Example. There was almost no change in optical density (OD) of the light-shielding film at the wavelength 193 nm of ArF excimer laser exposure light as compared with that at the time of the manufacture of the mask blank.

Then, an oxygen plasma treatment was further applied to the obtained binary mask. Specifically, by setting the inside of a chamber to an $O_2$ gas atmosphere ($O_2$ gas flow rate: 100 sccm, pressure: 5 Pa) and applying the RF ICP power at 750 W and the RF bias power at 250 W, the $O_2$ gas was formed into a plasma and the formed oxygen plasma was irradiated on the light-shielding film. In this event, the irradiation time of the oxygen plasma was set to 5 minutes.

Upon observing a section of the light-shielding film in detail after the oxygen plasma treatment using a TEM (transmission electron microscope), a coating film with a thickness of about 5 nm was formed at surface portions of side walls of a pattern formed by the MoSiON film/MoSi film/MoSiON film (particularly the MoSi film). Further, upon analyzing the composition of this coating film in detail, it was confirmed to be a film mainly containing Si and oxygen.

ArF excimer laser light was continuously irradiated on the binary mask subjected to the oxygen plasma treatment so that the total dose became 30 kJ/cm$^2$. A section of the light-shielding film pattern after the irradiation was observed in detail using a TEM (transmission electron microscope). As a result, a modified layer as conventionally formed was not particularly confirmed and, further, an increase in line width (CD change) was suppressed to less than 5 nm. Therefore, it is seen that the binary mask blank and the binary mask of this Example also have extremely high light fastness to accumulative irradiation of short-wavelength exposure light having a wavelength of 200 nm or less.

Example 6

This Example is the same as Example 5 except that, with respect to a light-shielding film, a MoSiON film (back-surface antireflection layer) was not formed, and a MoSi film (light-shielding layer) and a MoSiON film (front-surface antireflection layer) were formed under the following conditions so that the MoSi film (light-shielding layer) was changed to a MoSiN film (light-shielding layer), the thickness thereof and the Si content therein were changed, the thickness of the MoSiON film (front-surface antireflection layer) was changed, and the total thickness of the light-shielding film was changed.

The MoSiN film (light-shielding layer) in the light-shielding film was formed as a film made of molybdenum, silicon, and nitrogen (Mo: 9 at %, Si: 72.8 at %, N: 18.2 at %) and having a thickness of 52 nm. The MoSiON film (front-surface antireflection layer) in the light-shielding film was formed as a film made of molybdenum, silicon, oxygen, and nitrogen (Mo: 1.6 at %, Si: 38.8 at %, O: 18.6 at %, N: 41.1 at %) and having a thickness of 8 nm.

The total thickness of the light-shielding film was set to 60 nm. The optical density (OD) of the light-shielding film was 3.0 at the wavelength 193 nm of ArF excimer laser exposure light.

Then, a heat treatment was applied to the substrate formed with the light-shielding film. Specifically, using a heating furnace, the heat treatment was carried out in the atmosphere at a heating temperature of 550° C. for a heating time of 1 hour.

In the manner described above, a binary mask blank of this Example was manufactured.

Then, a binary mask was manufactured using this binary mask blank in the same manner as in Example 5. There was almost no change in optical density (OD) of the light-shielding film at the wavelength 193 nm of ArF excimer laser exposure light as compared with that at the time of the manufacture of the mask blank.

Then, an oxygen plasma treatment was applied to the obtained binary mask under the same conditions as in Example 5.

Upon observing a section of the light-shielding film in detail after the oxygen plasma treatment using a TEM (transmission electron microscope), a coating film with a thickness of about 5 nm was formed at surface portions of side walls of a pattern formed by the MoSiN film/MoSiON film (particularly the MoSiN film). Further, upon analyzing the composition of this coating film in detail, it was confirmed to be a film mainly containing Si and oxygen.

ArF excimer laser light was continuously irradiated on the binary mask subjected to the oxygen plasma treatment so that the total dose became 30 kJ/cm$^2$. A section of the light-shielding film pattern after the irradiation was observed in detail using a TEM (transmission electron microscope). As a result, a modified layer as conventionally formed was not particularly confirmed and, further, an increase in line width (CD change) was suppressed to less than 5 nm. Therefore, it is seen that the binary mask blank and the binary mask of this Example also have extremely high light fastness to accumulative irradiation of short-wavelength exposure light having a wavelength of 200 nm or less.

Comparative Example 1

Using a synthetic quartz glass substrate having a 6-inch square size with a thickness of 0.25 inches as a light-transmissive substrate, a light-semitransmissive film made of nitrided molybdenum and silicon was formed on the light-transmissive substrate.

Specifically, using a mixed target of molybdenum (Mo) and silicon (Si) (Mo:Si=10 mol %:90 mol %), reactive sputtering (DC sputtering) was carried out by setting the power of a DC power supply to 3.0 kW in a mixed gas atmosphere of argon (Ar), nitrogen ($N_2$), and helium (He) (gas flow rate ratio Ar:$N_2$:He=5:49:46) at a gas pressure of 0.3 Pa, thereby forming a MoSiN film made of molybdenum, silicon, and nitrogen and having a thickness of 69 nm.

Then, a heat treatment was applied to the light-transmissive substrate formed with the MoSiN film. Specifically, the heat treatment was carried out in the atmosphere at a heating temperature of 280° C. for a heating time of 2 hours, thereby obtaining a halftone phase shift mask blank. The MoSiN film after the heat treatment had a transmittance of 6.11% and a phase difference of 175.6 degrees for ArF excimer laser light. Upon observing a section of the MoSiN film in detail after the heat treatment using a TEM (transmission electron microscope), there was no particular change at a surface layer portion of the MoSiN film so that a coating film was not formed.

Then, a halftone phase shift mask was manufactured using this phase shift mask blank in the same manner as in Example 1. There was almost no change in transmittance and phase difference of the light-semitransmissive film in the manufactured phase shift mask as compared with those at the time of the manufacture of the mask blank.

ArF excimer laser light was continuously irradiated on the obtained phase shift mask of this Comparative Example so that the total dose became 30 kJ/cm². The transmittance and phase difference of the light-semitransmissive film (MoSiN film) after the irradiation were measured. As a result, the transmittance was 7.69% and the phase difference was 170.8 degrees for ArF excimer laser light. Therefore, changes after the irradiation were such that the change in transmittance was +1.58% and the change in phase difference was −4.8 degrees, and thus the changes were very large. If the changes on this level occur, the phase shift mask cannot be used any longer as a photomask. Further, a section of a light-semitransmissive film pattern was observed in detail using a TEM (transmission electron microscope). As a result, a modified layer as conventionally formed was confirmed and it was also confirmed that an increase in line width (CD change) due to the modified layer was 10 nm.

Comparative Example 2

A MoSiN film was formed as a light-semitransmissive film on a light-transmissive substrate in the same manner as in Comparative Example 1. Then, a heat treatment was applied to the light-transmissive substrate formed with the MoSiN film. Specifically, the heat treatment was carried out in the atmosphere at a heating temperature of 400° C. for a heating time of 2 hours, thereby obtaining a halftone phase shift mask blank. The MoSiN film after the heat treatment had a transmittance of 7.14% and a phase difference of 178.1 degrees for ArF excimer laser light. Upon observing a section of the MoSiN film in detail after the heat treatment using a TEM (transmission electron microscope), there was no particular change at a surface layer portion of the MoSiN film so that a coating film was not formed. Then, a halftone phase shift mask was manufactured using this phase shift mask blank in the same manner as in Example 1. There was almost no change in transmittance and phase difference of the light-semitransmissive film in the manufactured phase shift mask as compared with those at the time of the manufacture of the mask blank.

ArF excimer laser light was continuously irradiated on the obtained phase shift mask of this Comparative Example so that the total dose became 30 kJ/cm². The transmittance and phase difference of the light-semitransmissive film (MoSiN film) after the irradiation were measured. As a result, the transmittance was 7.77% and the phase difference was 174.8 degrees for ArF excimer laser light. Therefore, changes after the irradiation were such that the change in transmittance was +0.63% and the change in phase difference was −3.3 degrees, and thus the changes were very large. If the changes on this level occur, the phase shift mask cannot be used any longer as a photomask. Further, a section of a light-semitransmissive film pattern was observed in detail using a TEM (transmission electron microscope). As a result, a modified layer as conventionally formed was confirmed and it was also confirmed that an increase in line width (CD change) due to the modified layer was 8 nm.

What is claimed is:

1. A method of manufacturing a photomask blank having, on a light-transmissive substrate, a thin film for forming a transfer pattern, said method comprising:
   forming, on said light-transmissive substrate, said thin film made of a material containing a metal and silicon; and
   then performing a treatment to modify a main surface layer of said formed thin film in advance so that when exposure light having a wavelength of 200 nm or less is accumulatively irradiated on a thin film pattern of a photomask to be produced by patterning said thin film, a transfer characteristic of said thin film pattern does not change more than a predetermined degree,
   wherein said treatment increases the number of $SiO_2$ molecules at a surface layer of said formed thin film to form a layer containing silicon and oxygen at said surface layer of said formed thin film.

2. The method according to claim 1, wherein said treatment is a heat treatment in an atmosphere containing oxygen at 450° C. to 900° C.

3. The method according to claim 1, wherein said treatment is annealing by flash lamp irradiation in an atmosphere containing oxygen with an energy density of 5 to 14 J/cm2.

4. The method according to claim 1, wherein said treatment is an oxygen plasma treatment.

5. The method according to claim 1, wherein a surface layer, modified by said treatment, of said thin film has a thickness of 10 nm or less.

6. The method according to claim 1, wherein said treatment changes transmittance and phase difference of said thin film by said modified surface layer to plus (+), and a film design is carried out expecting the changes of said transmittance and said phase difference of said thin film.

7. The method according to claim 1, wherein said treatment is carried out so that, when ArF excimer laser light is continuously irradiated on said thin film pattern of said photomask, produced by patterning said thin film, to become 30 kJ/cm2 in total, the change in transmittance after the radiation is 0.60% or less and the change in phase difference is 3.0 degrees or less.

8. The method according to claim 1, wherein said treatment is carried out so that, when ArF excimer laser light is continuously irradiated on said thin film pattern of said photomask, produced by patterning said thin film, to become 30 kJ/cm2 in total, an increase in line width (line width change) is 5 nm or less.

9. The method according to claim 1, wherein said thin film is a light-semitransmissive film made of a material containing a compound of transition metal silicide.

10. The method according to claim 9, wherein said transition metal silicide is molybdenum silicide.

11. The method according to claim 1, wherein said thin film is a light-shielding film made of a material containing a compound of transition metal silicide.

12. The method according to claim 11, wherein said transition metal silicide is molybdenum silicide.

13. A method of manufacturing a photomask, comprising a step of patterning said thin film in the photomask blank according to claim 1 by etching.

14. A method of manufacturing a photomask blank having, on a light-transmissive substrate, a thin film for forming a transfer pattern, said method comprising:

forming, on said light-transmissive substrate, said thin film made of a material containing a metal and silicon; and then forming a protective film on said formed thin film so that when exposure light having a wavelength of 200 nm or less is accumulatively irradiated on a thin film pattern of a photomask to be produced by patterning said thin film, a transfer characteristic of said thin film pattern does not change more than a predetermined degree, wherein said protective film is made of a material which contains silicon and oxygen and in which $SiO_2$ molecules are increased relative to said formed thin film.

15. The method according to claim 14, wherein said protective film has a thickness of 15 nm or less.

16. The method according to claim 14, wherein said protective film is formed by reactive sputtering, using a Si target, in a mixed gas atmosphere of Ar and nitrogen monoxide (NO).

17. The method according to claim 14, wherein said treatment changes transmittance and phase difference of said thin film by said modified surface layer to plus (+), and a film design is carried out expecting the changes of said transmittance and said phase difference of said thin film.

18. The method according to claim 14, wherein said treatment is carried out so that, when ArF excimer laser light is continuously irradiated on said thin film pattern of said photomask, produced by patterning said thin film, to become 30 kJ/cm2 in total, the change in transmittance is 0.60% or less and the change in phase difference is 3.0 degrees or less.

19. The method according to claim 14, wherein said treatment is carried out so that, when ArF excimer laser light is continuously irradiated on said thin film pattern of said photomask, produced by patterning said thin film, to become 30 kJ/cm2 in total, an increase in line width (line width change) is 5 nm or less.

20. The method according to claim 14, wherein said thin film is a light-semitransmissive film made of a material containing a compound of transition metal silicide.

21. The method according to claim 20, wherein said transition metal silicide is molybdenum silicide.

22. The method according to claim 14, wherein said thin film is a light-shielding film made of a material containing a compound of transition metal silicide.

23. The method according to claim 22, wherein said transition metal silicide is molybdenum silicide.

24. A method of manufacturing a photomask, comprising a step of patterning said thin film in the photomask blank according to claim 14 by etching.

* * * * *